(12) United States Patent
Gongwer et al.

(10) Patent No.: US 6,486,715 B2
(45) Date of Patent: Nov. 26, 2002

(54) SYSTEM AND METHOD FOR ACHIEVING FAST SWITCHING OF ANALOG VOLTAGES ON LARGE CAPACITIVE LOAD

(75) Inventors: Geoffrey S. Gongwer, Los Altos, CA (US); Shahzad Khalid, Union City, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/825,615

(22) Filed: Apr. 2, 2001

(65) Prior Publication Data

US 2002/0140490 A1 Oct. 3, 2002

(51) Int. Cl.[7] ............................................ H03K 17/687
(52) U.S. Cl. ...................................... 327/111; 327/108
(58) Field of Search ................................. 327/108, 109, 327/111

(56) References Cited

U.S. PATENT DOCUMENTS

| | | | |
|---|---|---|---|
| 3,895,238 A | 7/1975 | Saari | 327/109 |
| 4,684,824 A | 8/1987 | Moberg | 326/82 |
| 5,726,936 A | 3/1998 | Whitfield | 365/185.23 |
| 6,043,570 A | 3/2000 | Kurata et al. | 327/111 |
| 6,075,391 A | * 6/2000 | Tarantola et a. | 327/111 |
| 6,140,847 A | * 10/2000 | Le Campion | 327/111 |

* cited by examiner

Primary Examiner—Dinh T. Le
(74) Attorney, Agent, or Firm—Skjerven Morrill LLP

(57) ABSTRACT

Driver (100) and method are provided for driving capacitive load (120) that achieve an improved response time without increasing power consumption of the driver. Driver (100) has load buffer (105) with an input (110) for receiving an input voltage (VIN), and an output 115 for coupling an output voltage ($V_{OUT}$) to load 120. $V_{OUT}$ is driven between a first voltage level ($V_1$) and a second voltage level ($V_2$) in response to changes in $V_{IN}$. Driver (100) also has reserve circuit (125) with capacitor (130), reserve buffer (135), switch (140) for coupling the capacitor to capacitive load (120) and controller (145) for operating the switch. Reserve buffer (135) has an input (150) for receiving an input voltage ($V_{RES\_IN}$), and an output (155) for coupling an output voltage ($V_{RES\_OUT}$) to capacitor (130) to charge the capacitor. Controller (145) is configured to operate switch (140) to couple capacitor (130) to capacitive load (120) when $V_{OUT}$ is being driven between $V_1$ and $V_2$.

20 Claims, 5 Drawing Sheets

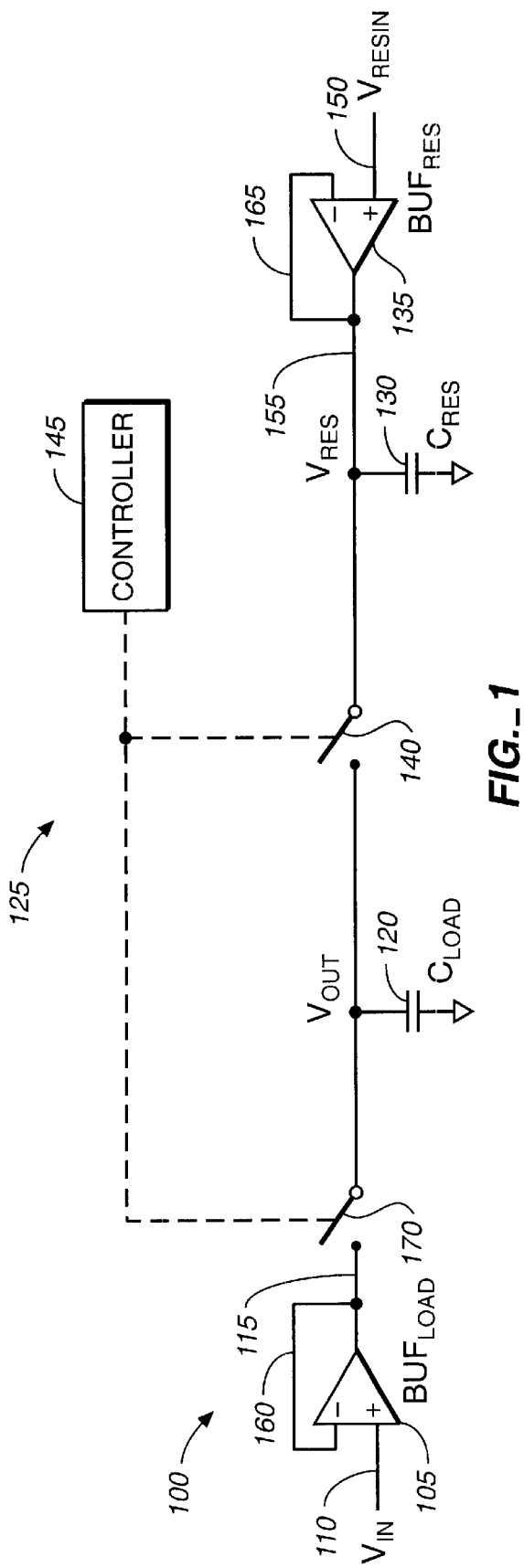
FIG._1

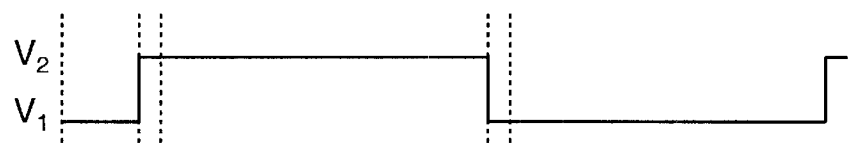
$V_{IN}$
FIG._2A
$V_{OUT}$
FIG._2B
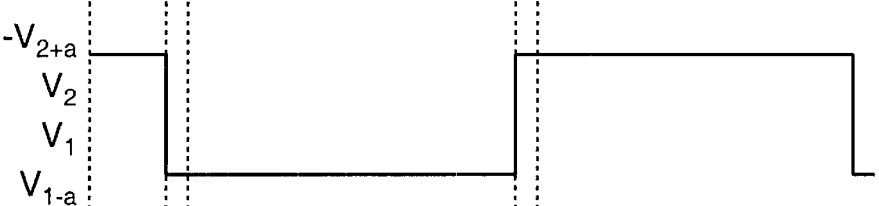
$V_{RES\_IN}$
FIG._2C
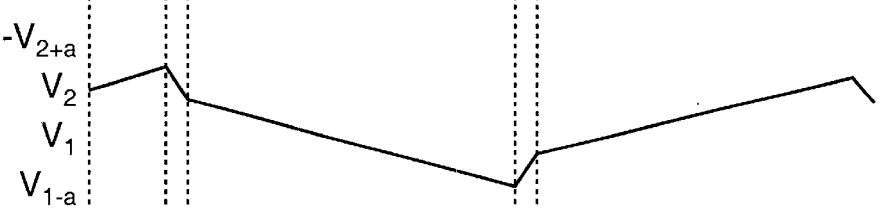
$V_{RES\_OUT}$
FIG._2D
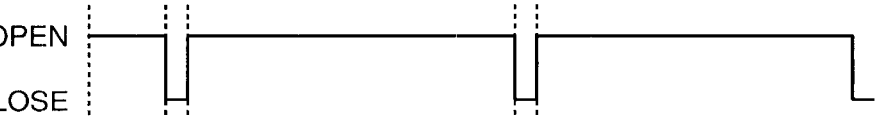
S140
FIG._3A
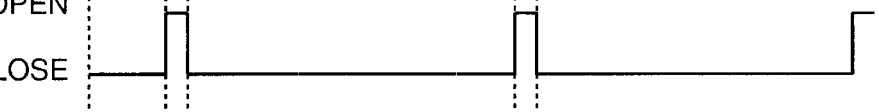
S170
FIG._3B

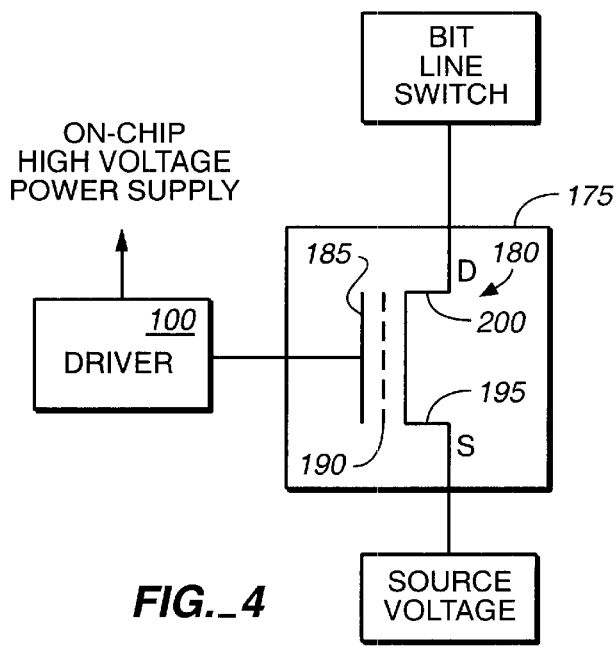
FIG._4
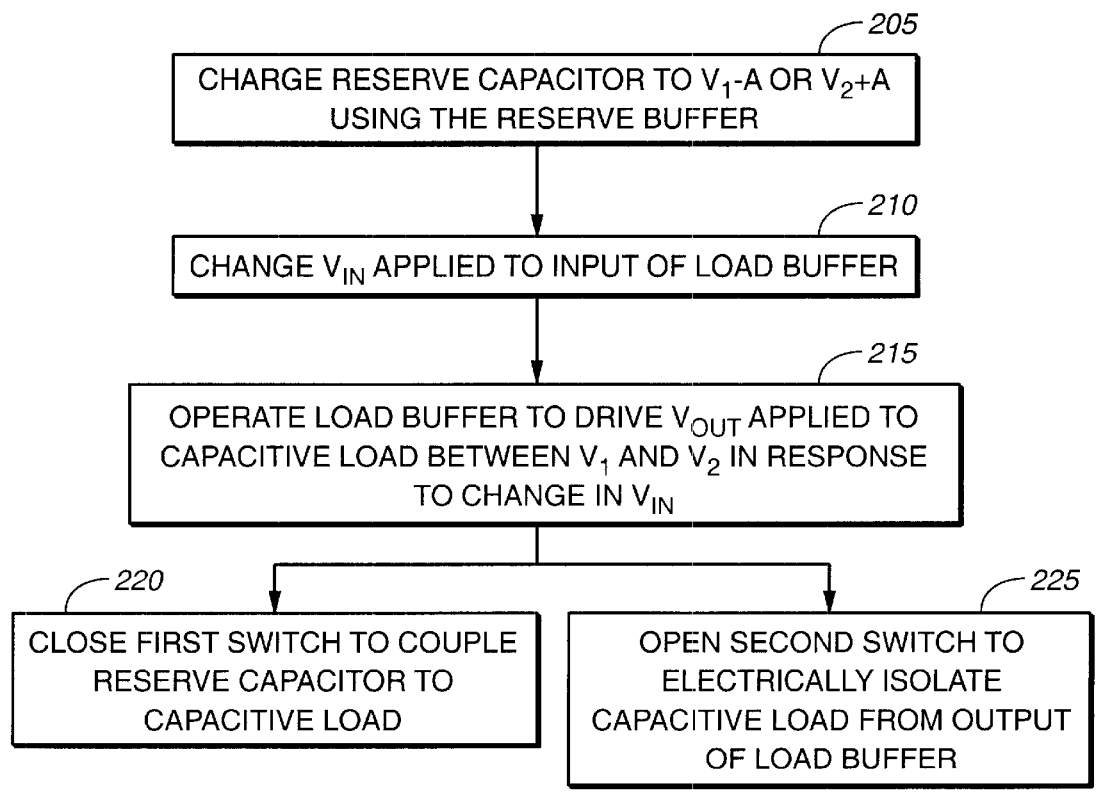
FIG._5

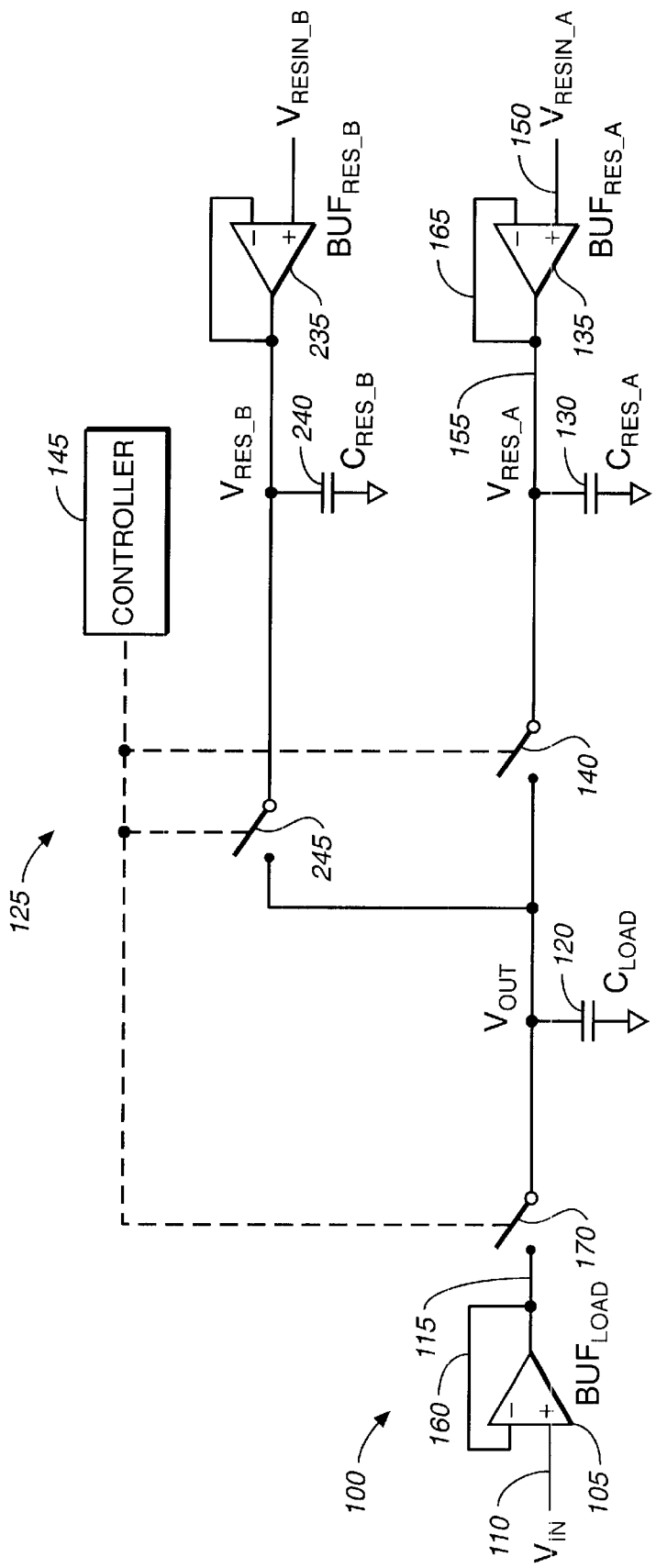
FIG._6

FIG._7A
FIG._7B
FIG._7C
FIG._7D
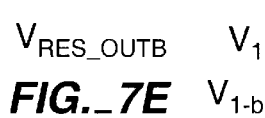
FIG._7E
FIG._7F

SYSTEM AND METHOD FOR ACHIEVING FAST SWITCHING OF ANALOG VOLTAGES ON LARGE CAPACITIVE LOAD

FIELD

The present invention relates generally to driving circuits for capacitive load, and more particularly to a system and method for achieving fast switching of analog voltages on a large capacitive load.

BACKGROUND

A conventional driving circuit or driver for driving a capacitive load typically consists of a signal input, a signal output and an amplifier or an analog voltage buffer to drive the load between two or more voltages. Two important properties of a buffer are power consumption and response time, which is the time required for the buffer to reach a specified output following the application of a specified input under specified operating conditions. Generally, these two properties cannot be optimized simultaneously. This is because improving response time means increasing unity gain frequency and slew rate, the ability of an amplifier to reflect a change in the input in the output quickly, both of which require increasing bias current of the buffer. Thus, reducing response time requires increasing power consumption, and reducing power consumption results in a increase in response time.

There are prior art designs for buffers that dynamically increase the bias current to improve the slew rate only when needed, thereby improving the response time while limiting the increase in power consumption. However, the design of such a buffer is complicated and exhibits several undesirable characteristics such as instability. These dynamic buffers also produce significant noise on supply lines during voltage transitions when the needed charge is drawn quickly, thereby requiring the addition of complex and often costly filters.

The above shortcomings of conventional driver circuits are particularly a problem for driving circuits used, for example, to drive floating gates of FETs (Field Effect Transistors) used in semiconductor devices such as storage elements or cells in non-volatile memory systems, such as electrically erasable programable read-only memory (EEPROM) or flash memory. The floating gate in an FET is not directly connected to the rest of the device and thus appears to the driving circuit as a purely capacitive load. This capacitive load can be quite large since a large number of storage elements in the non-volatile memory system, typically from 16 thousand to 10 million storage elements depending on the size of the memory, must be switched simultaneously between a programming voltage and a verify voltage. A programming voltage is a voltage applied to store information in the storage element as a charge on the floating gate. A verify voltage is used to determine if the storage element has stored a proper amount of charge and therefore the information. The transition between programming voltage and verify voltage and vice versa must be fast to achieve satisfactory write-performance. However, such driver circuits are frequently used in portable, battery operated devices in which the available power is limited and therefore must be conserved. Morever, the power for the driver circuit is usually supplied by an on-chip high-voltage-pump. Because both the generation and consumption of power produce heat that must be dissipated for the devices on the chip to function properly, conserving power is again necessary. Thus, increasing the bias current to improve the response time in the buffer is generally not desirable.

SUMMARY

Accordingly, there is a need for a driving circuit for driving a capacitive load that provides an improved response time to drive the load between two or more voltages without increasing power consumption of a buffer in the driving circuit.

In one aspect, the present invention provides a driver for driving a capacitive load, the driver having a load buffer with an input for receiving an input voltage ($V_{IN}$), and an output for coupling an output voltage ($V_{OUT}$) to the capacitive load. The load buffer is configured to drive $V_{OUT}$ between a first voltage level ($V_1$) and a second, higher voltage level ($V_2$) in response to a change in $V_{IN}$. The driver further includes a reserve circuit configured to reduce the time for $V_{OUT}$ to transition between $V_1$, and $V_2$. The reserve circuit has a reserve capacitor or capacitors, a reserve buffer, a switch for coupling the reserve capacitor to the capacitive load and a controller for opening and closing the switch. The reserve buffer has an input for receiving an input voltage ($V_{RES\_IN}$), and an output for coupling an output voltage ($V_{RES\_OUT}$) to the reserve capacitor to charge the capacitor. The controller is configured to operate the switch to couple the reserve capacitor to the capacitive load when $V_{OUT}$ is being driven between $V_1$ and $V_2$. Generally, the controller is coupled to the input of the load buffer, and is configured to operate the switch when a change in $V_{IN}$ is required.

In one embodiment, the reserve buffer includes a negative feedback loop to provide a gain that is substantially equal to unity. The reserve buffer is configured so that when $V_{IN}$ equals $V_1$, $V_{RES\_IN}$ has a steady state value of $V_2$+a, and when $V_{IN}$ equals $V_2$, $V_{RES\_IN}$ has a steady state value of $V_1$−a, where a equals $(V_2-V_1)C_{LOAD}/C_{RES}$, and where $C_{LOAD}$ is the capacitance of the capacitive load and $C_{RES}$ is the capacitance of the reserve capacitor.

In another embodiment, the driver includes a second switch for electrically isolating the capacitive load from the output of the load buffer. The second switch is operated by the controller to open when $V_{OUT}$ is being driven between $V_1$ and $V_2$. Desirably, the second switch is operated by the controller to simultaneously open when the first switch is closed and to close when the first switch is opened.

In yet another embodiment, the reserve circuit includes first and second reserves capacitors, $C_{RES\_A}$ and $C_{RES\_B}$, and first and second reserve buffers having inputs adapted to receive first and second input voltages, $V_{RES\_IN\_A}$ and $V_{RES\_IN\_B}$ respectively, and outputs adapted to couple first and second output voltage, $V_{RES\_OUT\_A}$ and $V_{RES\_OUT\_B}$ respectively, to charge $C_{RES\_A}$ and $C_{RES\_B}$. A single pole, double throw switch capable of alternately coupling $C_{RES\_A}$ and $C_{RES\_B}$ to the capacitive load, is operated by a controller to alternately couple $C_{RES\_A}$ and $C_{RES\_B}$ to the capacitive load when $V_{OUT}$ is being driven between $V_1$ and $V_2$.

The driver of the present invention is particularly useful in non-volatile memory systems such as a flash memory having a number of storage elements or cells with a number of Field Effect Transistors (FETs), each of the FETs having a gate coupled to the driver, and the driver configured to periodically drive the gates between a programming-voltage and a verify-voltage. Generally, the non-volatile memory system further includes a high-voltage-pump to supply voltage to both the load buffer and the reserve buffer. In one version of this embodiment, the storage elements, the driver and the high-voltage-pump are fabricated on a single semiconductor substrate.

In another aspect, a method is provided for operating the driver of the present invention. In the method, when $V_{IN}$ changes from $V_1$ to $V_2$ or from $V_2$ to $V_1$, the load buffer is then operated to drive $V_{OUT}$ from $V_1$ to $V_2$ or from $V_2$ to $V_1$ in response to the change in $V_{IN}$. At the same time, or shortly thereafter, the switch is closed to couple the reserve capacitor to the capacitive load, thereby reducing the time necessary for the capacitive load to transition between $V_1$ and $V_2$. Generally, the step of closing the switch involves closing the switch only briefly until $V_{OUT}$ has reached $V_1$ or $V_2$.

In one embodiment, as described above, the reserve circuit further includes a reserve buffer coupled to the reserve capacitor, and the method further includes the steps of charging the reserve capacitor to a voltage level ($V_{RES\_OUT}$) using the reserve buffer, and discharging the reserve capacitor into the capacitive load to raise the voltage applied to the capacitive load from $V_1$ to $V_2$. When, subsequently, the voltage applied to the capacitive load is to be lowered from $V_2$ to $V_1$, the switch is again closed and the capacitive load allowed to discharge into the reserve capacitor to rapidly lower the voltage applied to the capacitive load.

In another embodiment, as described above, the driver further includes a second switch for electrically isolating the capacitive load from the output of the load buffer, and the method involves opening the second switch to electrically isolate the capacitive load from the output of the load buffer. Desirably, the second switch is opened at the same time, or shortly before, the first switch is closed to couple the reserve capacitor to the capacitive load.

In yet another aspect, the invention is directed to a non-volatile memory system for storing information therein. The memory system includes a number of storage elements or cells having a number of Field Effect Transistors (FETs) with gates electrically isolated from sources and drains of the FETs, and a driver coupled to the gates to simultaneously drive the gates of the number of FETs between a verify voltage ($V_1$) and a programming voltage ($V_2$). The driver has a load buffer with an input adapted to receive an input voltage ($V_{IN}$), and an output adapted to couple an output voltage ($V_{OUT}$) to the gates, and means for reducing time for $V_{OUT}$ to transition between $V_1$ and $V_2$. The load buffer is configured to drive $V_{OUT}$ between $V_1$ and $V_2$ in response to a change in $V_{IN}$. Generally, the means for reducing time for $V_{OUT}$ to transition between $V_1$ and $V_2$ includes reserve circuit having a reserve capacitor, a reserve buffer having an input adapted to receive an input voltage ($V_{RES\_IN}$), and an output adapted to couple an output voltage ($V_{RES\_OUT}$) to the reserve capacitor to charge the reserve capacitor, a switch for coupling the reserve capacitor to the gates, and a controller for opening and closing the switch, the controller configured to operate the switch to couple the reserve capacitor to the gates when $V_{OUT}$ is being driven between $V_1$ and $V_2$.

In one embodiment, the memory system further includes a high-voltage-pump to supply voltage to the load buffer and the reserve buffer. Desirably, the storage elements, the driver and the high-voltage-pump are fabricated on a single substrate.

The advantages of the present invention include: (i) faster response time, (ii) efficient use of available power with substantially no increase in peak voltage needed from the existing high-voltage-pump, (iii) complete integration of driver including the reserve circuit onto a single substrate and (iv) reduced noise in the high-voltage-pump due to a steady, balanced consumption of current without any of the sharp increases or decreases that occur in prior art approaches.

BRIEF DESCRIPTION OF THE DRAWINGS

These and various other features and advantages of the present invention will be apparent upon reading of the following detailed description in conjunction with the accompanying drawings, where:

FIG. 1 is a block diagram of a driver for driving a capacitive load including a reserve circuit according to an embodiment of the present invention;

FIG. 2A is a graph of a voltage in ($V_{IN}$) applied to an input of a driver according to an embodiment of the present invention;

FIG. 2B is a graph of a voltage out ($V_{OUT}$) applied to a capacitive load by a driver according to an embodiment of the present invention;

FIG. 2C is a graph of a voltage in ($V_{RES\_IN}$) applied to an input of a reserve buffer in a driver according to an embodiment of the present invention;

FIG. 2D is a graph of a voltage out ($V_{RES\_OUT}$) of a reserve buffer in a driver according to an embodiment of the present invention;

FIG. 3A is a graph of the position of a first switch in a driver according to an embodiment of the present invention;

FIG. 3B is a graph of the position of a second switch in a driver according to an embodiment of the present invention for electrically isolate the load buffer from the capacitive load during transfer of charge between the capacitive load and reserve capacitor;

FIG. 4 is a block diagram of a storage element in a non-volatile memory system for which a driver according to an embodiment of the present invention is particularly useful;

FIG. 5 is a flowchart of a method for operating a driver according to the embodiment of the present invention;

FIG. 6 is a block diagram of a driver for driving a capacitive load including a reserve circuit according to an alternative embodiment of the present invention;

FIG. 7A is a graph of a voltage in ($V_{IN}$) applied to an input of the driver of FIG. 6 according to an embodiment of the present invention;

FIG. 7B is a graph of a voltage out ($V_{OUT}$) applied to a capacitive load by the driver of FIG. 6 according to an embodiment of the present invention;

FIG. 7C is a graph of a voltage out $V_{RES\_OUT\_A}$) of the first reserve buffer in the driver of FIG. 6 according to an embodiment of the present invention;

FIG. 7D is a graph of the position of a first switch in the driver of FIG. 6 for isolating the first reserve buffer from the capacitive load according to an embodiment of the present invention;

FIG. 7E is a graph of a voltage out ($V_{RES\_OUT\_B}$) of the second reserve buffer in the driver of FIG. 6 according to an embodiment of the present invention; and FIG. 7F is a graph of the position of a second switch in the driver of FIG. 6 for isolating the second reserve buffer from the capacitive load according to an embodiment of the present invention.

DETAILED DESCRIPTION

The present invention is directed to a driving circuit for driving a capacitive load that provides an improved response time to drive the load between two or more voltages without increasing power consumption of the driving circuit.

FIG. 1 shows a block diagram of an exemplary embodiment of a driving circuit or driver 100 according to the present invention. Referring to FIG. 1 driver 100 includes a load amplifier or buffer 105 having input 110 for a signal or input voltage ($V_{IN}$), and output 115 coupled to capacitive load 120 for applying an output voltage ($V_{OUT}$) to the capacitive load. In accordance with the present invention, driver 100 further includes reservoir or reserve circuit 125 having reserve capacitor 130, reserve amplifier or buffer 135 to charge the reserve capacitor, switch 140 capable of coupling the reserve capacitor to capacitive load 120, and controller 145 for opening and closing the switch. Reserve buffer 135 has input 150 for receiving a signal or input voltage ($V_{RES\_IN}$), and output 155 coupled to reserve capacitor 130 for applying an output voltage ($V_{RES\_OUT}$) to the reserve capacitor to charge the reserve capacitor. Switch 140 transfers the reserved charge from reserve capacitor 130 to capacitive load 120 during voltage transitions. Generally, both load buffer 105 and reserve buffer 135 have negative feedback furnished by negative feedback loops 160 and 165 respectively to provide a gain substantially equal to unity (unity gain) for both amplifiers up to a predetermined frequency (unity gain frequency).

Optionally, driver 100 includes second switch 170 connected between output 115 of load buffer 105 and capacitive load 120 to electrically isolate the load buffer from the capacitive load during transfer of charge between the capacitive load and reserve capacitor 130. Switch 170 prevents excessive current flow between load buffer 105 and reserve buffer 135 that could otherwise occur, depending on the design of the buffers. Switch 170 is also operated by controller 145 and typically is opened at the same time, or shortly before, first switch 140 is closed.

To better illustrate the operation of driver 100 of the present invention, various input voltages to load buffer 105 and reserve buffer 135 and the resulting output voltages or waveforms will now be described with reference to FIGS. 2A to 2D and with reference to the switch positions shown in FIGS. 3A and 3B.

Referring to FIG. 2A, it is seen that at time $t_0$ $V_{IN}$ is substantially equal to a first voltage level ($V_1$), and, because load buffer 105 has a unity gain and switch 140 is opened (FIG. 3A) and switch 170 closed (FIG. 3B), $V_{OUT}$ is also at a voltage level substantially equal to $V_1$, as seen in FIG. 2B. A voltage level equal to a second, higher voltage level ($V_2$) plus an amount, a, is applied to reserve buffer 135, FIG. 2C, to charge reserve capacitor 130 to a voltage level substantially equal to $V_2$+a, FIG. 2D, where the value of a and $C_{RES}$ are chosen such that:

$$a=(V_2-V_1)C_{LOAD}/C_{RES}$$

where $C_{LOAD}$ is the capacitance of capacitive load 120 and $C_{RES}$ is the capacitance of reserve capacitor 130. In practice, it may not be possible to generate the ideal levels for $V_{RES\_IN}$ as shown in FIG. 2C due to uncertainty in the capacitance of capacitive load 120. Therefore, $V_{OUT}$ may not precisely reach its desired level after charge transfer, however this is not a problem as long as it is close to the desired value, since load buffer 105 can quickly make any small adjustments needed to bring $V_{OUT}$ to the desired voltage. Nevertheless, it is desirable that the value of reserve capacitor 130 be chosen such that $V_{OUT}$ is brought to within about 2 to about 6 percent of the desired level by the charge transfer. Furthermore, the circuit generating $V_{RES\_IN}$ (not shown) can be made trimable or adjustable to adjust the value of $V_{RES\_OUT}$ as needed to adjust the charge transferred from reserve capacitor 130 to capacitive load 120.

At time $t_1$ a transition or transition cycle occurs in which $V_{IN}$ is raised from $V_1$ to $V_2$. Switch 140 is closed, as indicated in FIG. 3A, allowing reserve capacitor 130 to discharge into capacitive load 120, as shown by the drop in $V_{RES\_OUT}$ in FIG. 2C, raising the voltage applied to the capacitive load, $V_{OUT}$, rapidly to $V_2$ as shown in FIG. 2B. At the same time, $V_{RES\_IN}$ is set to a level equal to $V_1$–a to prepare reserve circuit 125 for switching the voltage applied to capacitive load 120, $V_{OUT}$, to $V_1$. Optionally, switch 170 is opened electrically isolating capacitive load 120 from load buffer 105 to prevent excessive current flow between the buffers.

A short time later, at time $t_2$, switch 140 is opened as shown in FIG. 3A. $V_{IN}$ continues at a voltage level of $V_2$ to maintain $V_{OUT}$ at a voltage level substantially equal to $V_2$. $V_{RES\_IN}$ is maintained at a voltage level substantially equal to $V_1$–a to discharge reserve capacitor 130.

At time $t_3$ $V_{IN}$ drops to a voltage level equal to $V_1$ as shown in FIG. 2A. Controller 145 aware of the change in VIN closes switch 140 and, optionally, opens switch 170 as shown in FIGS. 3A and 3B respectively enabling capacitive load 120 to discharge to reserve capacitor 130 bringing both $V_{RES\_OUT}$ and $V_{OUT}$ to a voltage level substantially equal to $V_1$.

At time $t_4$, switch 140 is opened as shown in FIG. 3A. $V_{IN}$ continues at a voltage level of $V_1$ to maintain $V_{OUT}$ at a voltage level substantially equal to $V_1$. $V_{RES\_IN}$ is maintained at a voltage level substantially equal to $V_2$+a to charge reserve capacitor 130 in preparation for the next transition cycle.

It will be appreciated that because the charge required during the transition cycle is accumulated in reserve capacitor 130 during the time period between transitions cycles, and quickly transferred to capacitive load 120 during the transition cycle, the transition between two or more known or predetermined discrete, voltage levels is rapid in comparison with conventional drivers for driving a capacitive load. Also, because the charge required is accumulated in reserve capacitor 130 during the time period between transitions cycles, and because load buffer 105 uses little power to maintain capacitive load 120 at the desired voltage level between transition cycles, current from a power supply (not shown) supplying the load buffer and reserve buffer 135 is consumed in a smooth fashion without any of the sharp increases or decreases in current that can occur during the transition cycles with conventional drivers. Thus, because current is consumed in a smooth fashion noise in the power supply, which could adversely effect performance of driver 100 or capacitive load 120, is reduced, thereby reducing supply and filtering requirements. Furthermore, the efficiency of driver 100 is increased because the power supply can be designed to meet a lower, steady state power demand rather than a higher peak value required during transitions as in conventional drivers. Moreover, since the response time is determined primarily by reserve capacitor 130, the efficiency of driver 100 can be further enhanced and the cost reduced by providing buffers 105, 135, having a simple design with small fixed bias currents to save power.

Driver 100 of the present invention is particularly useful in anon-volatile memory system, such as an Electrically Erasable Programmable Read Only Memory (EEPROM) or flash memory having a number of storage elements or cells for storing data therein. An example of a storage element in a memory system is shown in FIG. 4. For purposes of clarity, many of the details of storage elements that are widely known and are not relevant to the present invention have been omitted. Storage elements are described in more detail in, for example, U.S. Pat. No. 5,862,080, which is incorporated herein by reference. Referring to FIG. 4, a memory system typically includes a number of storage elements 175 each having one or more Field Effect Transistors (FETs 180)

each having control gate or gate 185 and isolated or floating gate 190, which is electrically isolated from source 195 and drain 200 of the FET. Because gate 185 capacitively couples with floating gate 190 to control FET 180 it appears to driver 100 as a capacitive load. Because a large number of storage elements in the non-volatile memory system (not shown) are typically programed simultaneously, and because a large number of the gates 185 in storage element 175 must be switched simultaneously between a programming voltage and a verify voltage to program the storage element, the gates appear to driver 100 as a single, large capacitive load. Furthermore, to achieve satisfactory write performance, transitions from programming voltage to verify voltage, response time, must be very rapid. Moreover, as is usually the case, the power or bias current for driver 100 is supplied from an on-chip high-voltage pump (not shown), power used by the driver must be limited or conserved to avoid overtaxing the on-chip high-voltage pump and conserve energy.

A method or process for operating driver 100 to drive capacitive load 120 between two, known discreet voltage levels will now be described with reference to FIG. 5. FIG. 5 is a flowchart showing a process for driving a capacitive load according to an embodiment of the present invention. Referring to FIG. 5, the process generally involves the initial step of charging reserve capacitor 130 to $V_1$–a or $V_2$+a using the reserve buffer 135 (Step 205). Controller 145 changes $V_{IN}$ applied to input 110 of load buffer (Step 210). Load buffer 105 is operated to drive $V_{OUT}$ applied to capacitive load 120 between $V_1$ and $V_2$ in response to the change in $V_{IN}$ (Step 215). At the same time, or shortly thereafter, controller 145 closes switch 140 to couple reserve capacitor 130 to capacitive load 120, discharging the reserve capacitor into the capacitive load, or vice versa until $V_{OUT}$ has reached $V_1$ or $V_2$ (Step 220). Optionally, the method comprises the further step of opening switch 170 to electrically isolate capacitive load 120 from output 115 of load buffer 105 (Step 225).

An alternative embodiment according to the present invention in which the driver has a number of reserve buffers and a number of reserve capacitors for rapidly switching $V_{OUT}$ applied to a large capacitive load will now be described with reference to FIG. 6 and FIGS. 7A to 7F. FIG. 6 shows a block diagram of the driver in which the reserve circuit further includes a second reserve buffer 235 and a second reserve capacitor ($C_{RES\_B}$ 240) isolated from the capacitive load 120 by a second switch 245. The first reserve buffer 135 is adapted to receive a first input voltage ($V_{RES\_IN\_A}$), and to couple a first output voltage ($V_{RES\_OUT\_A}$) to first reserve capacitor ($C_{RES\_A}$ 130). The second reserve buffer 235 is adapted to receive a second input voltage ($V_{RES\_IN\_B}$), and to couple a second output voltage ($V_{RES\_OUT\_B}$) to $C_{RES\_B}$ 240. Switches 140 and 245, are operated by controller 145 to alternately couple $C_{RES\_A}$ and $C_{RES\_B}$ to the capacitive load when $V_{OUT}$ is being driven between $V_1$ and $V_2$. This embodiment has the advantage of consuming even less power than the embodiment of FIG. 1. The embodiment of FIG. 6 consumes less power than that of the embodiment of FIG. 1 because using two separate reserve capacitors avoids the need to alternate the charge on the reserve capacitor between $V_2$ and $V_1$, as in FIG. 1.

In yet another alternative embodiment (not shown), switches 140 and 245 are replaced wit a single pole, double throw switch having a common terminal coupled to capacitive load 120 and capable of coupling the capacitive load either to $C_{RES\_A}$ 130 or $C_{RES\_B}$ 240.

FIGS. 7A to 7F show the various input voltages to load buffer 105, first reserve buffer 135, second reserve buffer 235, the resulting output voltages or waveforms and positions of switches 140 and 245. Although, FIG. 6 is shown as including optional switch 170 for electrically isolating load buffer 105 from reserve circuit 125, a graph of the position is of switch 170 is not provided. It is to be noted that the position for this optional switch 170 relative to switches 140 and 245 is similar to that described above for FIG. 3B. Thus, switch 170 when present is generally open when either switch 140 or switch 245 is closed, and closed when both switches 140 and 245 are open.

Referring to FIG. 7A, it is seen that at time $t_0$ $V_{IN}$ is substantially equal to first voltage level ($V_1$), and, because load buffer 105 has a unity gain and switch 140 is opened (FIG. 7D), $V_{OUT}$ is also at a voltage level substantially equal to $V_1$, as seen in FIG. 7B. A substantially constant voltage level (not show), which is equal to second voltage level ($V_2$) plus amount, a, is applied to the first reserve buffer 135 to charge first reserve capacitor 130 to a voltage level ($V_{RES\_OUT\_A}$) substantially equal to $V_2$+a, FIG. 7C.

At time $t_1$ a transition or transition cycle occurs in which $V_{IN}$ is raised from $V_1$ to $V_2$. Switch 140 is closed, as indicated in FIG. 7D, allowing first reserve capacitor 130 to discharge into capacitive load 120, as shown by the drop in $V_{RES\_OUT\_A}$ in FIG. 7C, raising the voltage applied to the capacitive load, $V_{OUT}$, rapidly to $V_2$ as shown in FIG. 7B. A short time later, at time $t_2$, switch 140 is opened as shown in FIG. 7D, and from $t_2$ to $t_5$ $V_{RES\_OUT\_A}$ rises charging first reserve capacitor 130 to a voltage level substantially equal to $V_2$+a, in preparation for the next transition of $V_{IN}$ from $V_1$, to $V_2$.

Simultaneously with the above, a substantially constant voltage level (not show), which is equal to second voltage level ($V_1$) minus amount, a, is applied to the second reserve buffer 235 to charge second reserve capacitor 240 to a voltage level ($V_{RES\_OUT\_B}$) substantially equal to $V_1$–a, FIG. 7E. From $t_2$ to $t_3$ $V_{RES\_OUT\_B}$ continues to rise charging second reserve capacitor 240 to a voltage level substantially equal to $V_1$–a, in preparation for transition of $V_{IN}$ from $V_2$ to $V_1$. At time $t_3$ switch 245 is closed, as indicated in FIG. 7F, allowing second reserve capacitor 240 to charge capacitive load 120, as shown by the rise in $V_{RES\_OUT\_B}$ in FIG. 7E, lowering the voltage applied to the capacitive load 120, $V_{OUT}$, rapidly to $V_1$ as shown in FIG. 7B. A short time later, at time $t_4$, switch 245 is opened as shown in FIG. 7F, and $V_{RES\_OUT\_B}$ charges second reserve capacitor 240 to a voltage level substantially equal to $V_1$–a, in preparation for the next transition of $V_{IN}$ from $V_2$ to $V_1$.

From $t_5$ to $t_6$ switch 140 is again closed and the above series of events repeated to drive $V_{OUT}$ rapidly from $V_1$ to $V_2$.

It has been found that for a non-volatile memory system having an on-chip high-voltage pump and a number of storage elements 175, each with a number of FETs 180 sufficient to provide a capacitive load of about 1 nanofarad (nf) when driven at about 7 volts and about 700 microamps ($\mu$A), a driver according to the present invention will provide a response time of from about 200 nanoseconds (nS), an improvement or reduction in response time of about 90 percent over a conventional driver, which typically has a response time of at least 2 microseconds ($\mu$S) for driving such a capacitive load. In addition, driver 100 achieves this increase in performance substantially without an increase in power consumption. In certain circumstances, because the design of buffers 105, 135, can be simplified and the bias current reduced, power consumption can be reduced from about 30 to about 70 percent over a conventional driver.

It is to be understood that even though numerous characteristics and advantages of certain embodiments of the present invention have been set forth in the foregoing description, together with details of the structure and function of various embodiments of the invention, this disclosure is illustrative only, and changes may be made in detail, especially in matters of structure and arrangement of parts within the principles of the present invention. For example, other embodiments may use charge sharing for one of the of transitions (low to high or high to low) only. This may be desirable if only one type of transition is required to happen quickly, or if the buffer driving the capacitive load can cause one type of transition much faster than other, i.e., if the load buffer can switch load from a low to high voltage quickly by itself, then the methods described above may be used only for high to low transition. Still other embodiments may use more than two reserve capacitors and/or reserve buffers for applications when $V_{IN}$ is required to change among more than two voltage levels. Thus, the scope of the appended claims should not be limited to the preferred embodiments described herein, but to the full extent indicated by the broad general meaning of the terms in which they are expressed.

What is claimed:

1. A driver for driving a capacitive load, the driver comprising:
    a load buffer having an input adapted to receive an input voltage ($V_{IN}$), and an output adapted to couple an output voltage ($V_{OUT}$) to the capacitive load, the load buffer configured to drive $V_{OUT}$ between a first voltage level ($V_1$) and a second, higher voltage level ($V_2$) in response to a change in $V_{IN}$; and
    a reserve circuit configured to reduce time for $V_{OUT}$ to transition between $V_1$ and $V_2$, the reserve circuit comprising:
        a reserve capacitor;
        a reserve buffer having an input adapted to receive an input voltage ($V_{RES\_IN}$), and an output adapted to couple an output voltage ($V_{RES\_OUT}$) to the reserve capacitor to charge the reserve capacitor;
        a first switch whereby the reserve capacitor can be coupled to the capacitive load; and
        a controller whereby the first switch can be opened and closed, the controller configured to operate the first switch to couple the reserve capacitor to the capacitive load when $V_{OUT}$ is being driven between $V_1$ and $V_2$.

2. A driver according to claim 1, wherein the controller is coupled to the input of the load buffer to detect a change a in $V_{IN}$.

3. A driver according to claim 1, wherein the reserve buffer comprises negative feedback to provide a gain substantially equal to unity.

4. A driver according to claim 3, wherein the reserve buffer is configured so that when $V_{RES\_IN}$ equals $V_1$, $V_{RES\_OUT}$ has a steady state value of $V_1-a$, and when $V_{RES\_IN}$ equals $V_2$, $V_{RES\_OUT}$ has a steady state value of $V_2+a$, where a equals $(V_2-V_1)C_{LOAD}/C_{RES}$, and where $C_{LOAD}$ is a capacitance of the capacitive load and $C_{RES}$ is a capacitance of the reserve capacitor.

5. A driver according to claim 1, further including a second switch whereby the capacitive load can be electrically isolated from the output of the load buffer.

6. A driver according to claim 5, wherein the second switch is operated by the controller, and wherein the controller is configured to open the second switch when $V_{OUT}$ is being driven between $V_1$ and $V_2$.

7. A driver according to claim 6, wherein the second switch is operated by the controller to open when the first switch is closed and to close when the first switch is opened.

8. A non-volatile memory system having a driver according to claim 1, and further comprising a plurality of storage elements having a plurality of Field Effect Transistors (FETs) with gates coupled to the driver, the driver configured to periodically drive the gates between a programming voltage and a voltage for determining the state of said storage elements.

9. In a driver for driving a capacitive load, the driver having a load buffer with an input and an output coupled to the capacitive load, and a reserve circuit with a reserve capacitor and a first switch capable of coupling the reserve capacitor to the capacitive load, a method of operating the driver comprising steps of:
    changing an input voltage ($V_{IN}$) applied to the input of the load buffer;
    operating the load buffer to drive an output voltage ($V_{OUT}$) applied to the capacitive load between a first voltage level ($V_1$) and a second voltage level ($V_2$) in response to the change in $V_{IN}$; and
    closing the first switch to couple the reserve capacitor to the capacitive load,
    whereby time for the capacitive load to transition between $V_1$ and $V_2$ is reduced.

10. A method according to claim 9, wherein the step of closing the first switch comprises the step of closing the first switch briefly until $V_{OUT}$ has reached $V_1$ or $V_2$.

11. A method according to claim 10, wherein the step of closing the first switch comprises the step of closing the first switch briefly until $V_{OUT}$ is within ±5% of $V_1$ or $V_2$.

12. A method according to claim 9, wherein the reserve circuit further comprises a reserve buffer coupled to the capacitor, and wherein the method further comprises the initial step of charging the capacitor to a voltage level ($V_{RES\_OUT}$) with the reserve buffer.

13. A method according to claim 12, wherein $V_2$ is higher than $V_1$, and wherein the method further comprises the step of discharging the reserve capacitor into the capacitive load to raise the voltage applied to the capacitive load from $V_1$ to $V_2$.

14. A method according to claim 9, wherein $V_2$ is higher than $V_1$, and wherein the method further comprises the step of discharging the capacitive load into the reserve capacitor to lower the voltage applied to the capacitive load from $V_2$ to $V_1$.

15. A method according to claim 9, wherein the driver further comprises a second switch capable of electrically isolating the capacitive load from the output of the load buffer, and wherein the method further comprises the step of opening the second switch to electrically isolate the capacitive load from the output of the load buffer.

16. A non-volatile memory system for storing information therein, the non-volatile memory system comprising;
    a plurality of storage elements having a plurality of Field Effect Transistors (FETs) with gates electrically isolated from sources and drains of the FETs; and
    a driver coupled to the gates to sequentially drive the gates of the plurality of FETs between a voltage for determining the state of said storage elements ($V_1$) and a programming voltage ($V_2$), the driver comprising:
        a load buffer having an input adapted to receive an input voltage (VIN), and an output adapted to couple an output voltage ($V_{OUT}$) to the gates, the load buffer configured to drive $V_{OUT}$ between $V_1$ and $V_2$ in response to a change in $V_{IN}$; and
        means adapted to couple to the gates for reducing time for $V_{OUT}$ to transition between $V_1$ and $V_2$.

17. A non-volatile memory system according to claim 16, wherein the means for reducing time for $V_{OUT}$ to transition between $V_1$ and $V_2$ comprises a reserve circuit having:

a reserve capacitor;

a reserve buffer having an input adapted to receive an input voltage ($V_{RES\_IN}$), and an output adapted to couple an output voltage ($V_{RES\_OUT}$) to the reserve capacitor to charge the reserve capacitor;

a first switch whereby the reserve capacitor can be coupled to the gates; and controller whereby the first switch can be opened and closed, the controller configured to operate the first switch to couple the reserve capacitor to the gates when $V_{OUT}$ is being driven between $V_1$ and $V_2$.

18. A method of driving a capacitive load from a first voltage level ($V_1$) to a second voltage level ($V_2$), the method comprising steps of:

providing a reserve capacitor;

charging the reserve capacitor a predetermined voltage; and coupling the reserve capacitor to the capacitive load to drive the capacitive load from $V_1$ to $V_2$, whereby time for the capacitive load to transition between $V_1$ and $V_2$ is reduced.

19. A method according to claim 18, wherein a size of the reserve capacitor and the predetermined voltage are selected to achieve the transition between $V_1$ and $V_2$ on the capacitive load within a predetermined time.

20. A driver for driving a capacitive load, the driver comprising:

a load buffer having an input adapted to receive an input voltage (VIN), and an output adapted to couple an output voltage ($V_{OUT}$) to the capacitive load, the load buffer configured to drive $V_{OUT}$ between a first voltage level ($V_1$) and a second, higher voltage level ($V_2$) in response to a change in $V_{IN}$; and a reserve circuit configured to reduce time for $V_{OUT}$ to transition between $V_1$ and $V_2$, the reserve circuit comprising:

a first reserve capacitor ($C_{RES\_A}$);

a first reserve buffer having an input adapted to receive a first input voltage ($V_{RES\_IN\_A}$), and an output adapted to couple a first output voltage ($V_{RES\_OUT\_A}$) to $C_{RES\_A}$ to charge $C_{RES\_A}$;

a second reserve capacitor ($C_{RES\_B}$);

a second reserve buffer having an input adapted to receive a second input voltage ($V_{RES\_IN\_B}$), and an output adapted to couple a second output voltage ($V_{RES\_OUT\_B}$) to $C_{RES\_B}$ to charge $C_{RES\_B}$;

a switch whereby the $C_{RES\_A}$ and $C_{RES\_B}$ can be alternately coupled to the capacitive load; and a controller whereby the switch can be operated, the controller configured to operate the switch to alternately couple $C_{RES\_A}$ and $C_{RES\_B}$ to the capacitive load when $V_{OUT}$ is being driven between $V_1$ and $V_2$.

* * * * *